US011923250B2

(12) United States Patent
Chou et al.

(10) Patent No.: US 11,923,250 B2
(45) Date of Patent: Mar. 5, 2024

(54) FIN LOSS PREVENTION

(71) Applicant: TAIWAN SEMICONDUCTOR MANUFACTURING COMPANY, LTD., Hsinchu (TW)

(72) Inventors: Hung-Ju Chou, Taipei (TW); Chih-Chung Chang, Nantou County (TW); Jiun-Ming Kuo, Taipei (TW); Che-Yuan Hsu, Hsinchu (TW); Pei-Ling Gao, Hsinchu (TW); Chen-Hsuan Liao, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/875,466

(22) Filed: Jul. 28, 2022

(65) Prior Publication Data
US 2023/0008005 A1 Jan. 12, 2023

Related U.S. Application Data

(62) Division of application No. 16/787,906, filed on Feb. 11, 2020, now Pat. No. 11,705,372.

(51) Int. Cl.
H01L 21/8238 (2006.01)
H01L 21/02 (2006.01)
(Continued)

(52) U.S. Cl.
CPC ........... *H01L 21/823807* (2013.01); *H01L 21/02532* (2013.01); *H01L 21/02609* (2013.01);
(Continued)

(58) Field of Classification Search
CPC ....... H01L 21/823807; H01L 21/02532; H01L 21/02609; H01L 21/3065;
(Continued)

(56) References Cited

U.S. PATENT DOCUMENTS 9,093,530 B2   7/2015 Huang et al.
9,105,490 B2   8/2015 Wang et al.
(Continued)

FOREIGN PATENT DOCUMENTS

KR   20190024523 A   3/2019

*Primary Examiner* — Mohammad A Rahman
(74) *Attorney, Agent, or Firm* — Sterne, Kessler, Goldstein & Fox P.L.L.C.

(57) ABSTRACT

The embodiments described herein are directed to a method for reducing fin oxidation during the formation of fin isolation regions. The method includes providing a semiconductor substrate with an n-doped region and a p-doped region formed on a top portion of the semiconductor substrate; epitaxially growing a first layer on the p-doped region; epitaxially growing a second layer different from the first layer on the n-doped region; epitaxially growing a third layer on top surfaces of the first and second layers, where the third layer is thinner than the first and second layers. The method further includes etching the first, second, and third layers to form fin structures on the semiconductor substrate and forming an isolation region between the fin structures.

20 Claims, 13 Drawing Sheets

(51) Int. Cl.
  *H01L 21/3065* (2006.01)
  *H01L 27/092* (2006.01)
  *H01L 29/04* (2006.01)
  *H01L 29/06* (2006.01)
  *H01L 29/10* (2006.01)
  *H01L 29/161* (2006.01)

(52) U.S. Cl.
  CPC .. *H01L 21/3065* (2013.01); *H01L 21/823821* (2013.01); *H01L 21/823878* (2013.01); *H01L 21/823892* (2013.01); *H01L 27/0924* (2013.01); *H01L 27/0928* (2013.01); *H01L 29/045* (2013.01); *H01L 29/0653* (2013.01); *H01L 29/1054* (2013.01); *H01L 29/1083* (2013.01); *H01L 29/161* (2013.01)

(58) Field of Classification Search
  CPC ..... H01L 21/823821; H01L 21/823878; H01L 21/823892; H01L 27/0924; H01L 27/0928; H01L 29/0653; H01L 29/1054; H01L 29/1083; H01L 29/161; H01L 21/823481; H01L 21/02381; H01L 21/0245; H01L 21/0262; H01L 21/76224; H01L 21/02573; H01L 21/823431; H01L 21/845; H01L 27/0886; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365
  See application file for complete search history.

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,614,086 B1 | 4/2017 | Yeo et al. |
| 9,831,183 B2 | 11/2017 | Lin et al. |
| 9,847,334 B1 | 12/2017 | More et al. |
| 9,859,386 B2 | 1/2018 | Ho et al. |
| 10,147,651 B1 | 12/2018 | Bi et al. |
| 10,181,426 B1 | 1/2019 | Ching et al. |
| 10,868,015 B2 | 12/2020 | Chiang et al. |
| 2015/0041855 A1 | 2/2015 | Liao et al. |
| 2016/0056156 A1 | 2/2016 | Ghani et al. |
| 2017/0005195 A1 | 1/2017 | Ching et al. |
| 2017/0104061 A1 | 4/2017 | Peng et al. |
| 2018/0122916 A1 | 5/2018 | Fang et al. |
| 2018/0315664 A1 | 11/2018 | Cheng et al. |
| 2018/0315752 A1 | 11/2018 | Fan et al. |
| 2018/0350969 A1* | 12/2018 | Ching .................... H01L 29/16 |
| 2019/0131274 A1 | 5/2019 | Wo et al. |
| 2019/0189523 A1 | 6/2019 | Zhu et al. |
| 2021/0249312 A1 | 8/2021 | Chou et al. |

* cited by examiner

FIN LOSS PREVENTION

CROSS-REFERENCE TO RELATED APPLICATIONS

This application is a divisional of U.S. patent application Ser. No. 16/787,906, titled "Fin Loss Prevention," filed on Feb. 11, 2020, which is incorporated herein by reference in its entirety.

BACKGROUND

Fin oxidation during the formation of isolation regions in fin field effect transistors (finFETs) can lead to fin width loss which in turn is responsible for transistor performance degradation and yield loss. Silicon-germanium fin structures are particularly sensitive to fin width loss during the formation of isolation regions between the fin structures.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
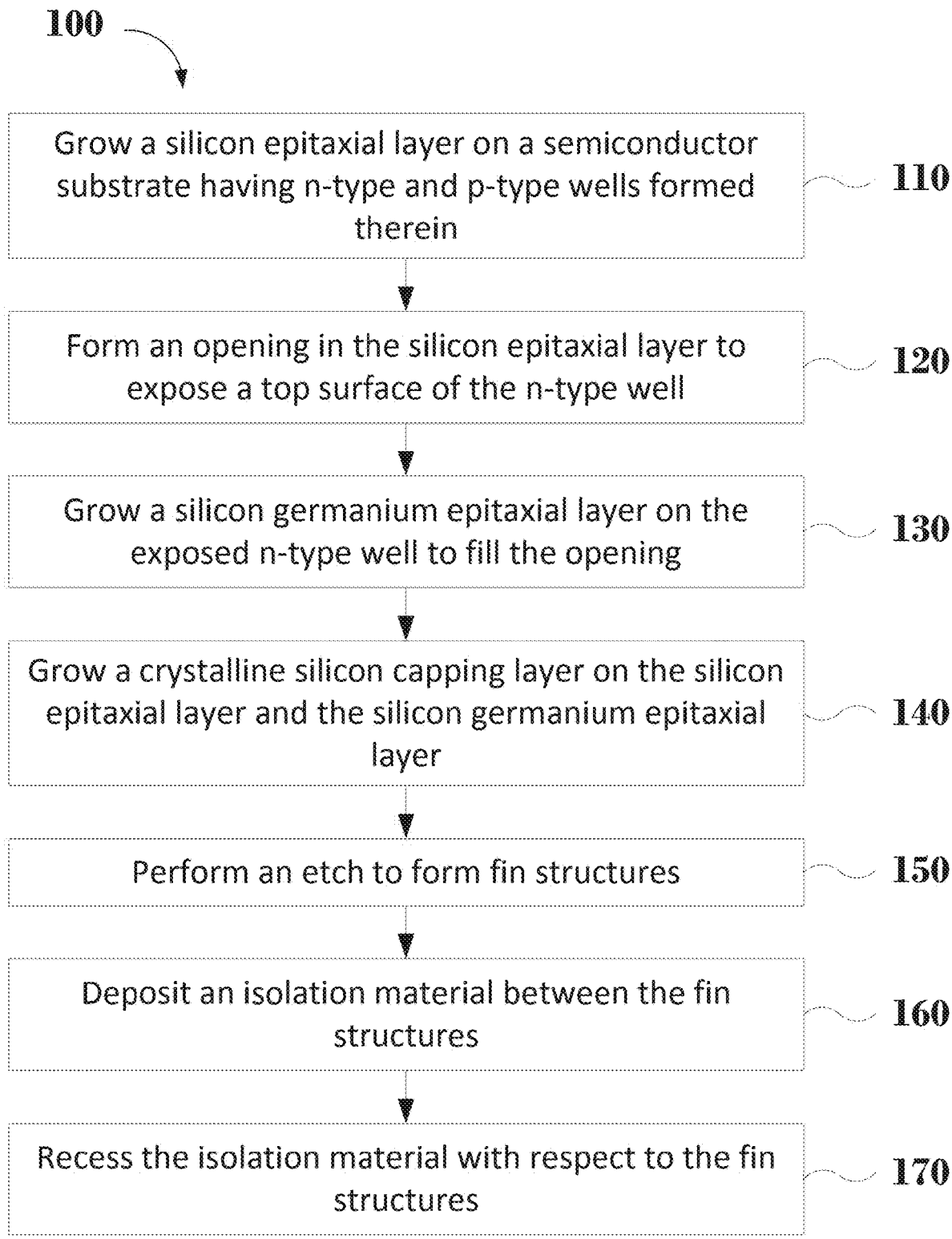
FIG. 1 is a flow diagram of a fabrication method for forming a crystalline silicon capping layer on semiconductor fin structures to prevent fin oxidation during the formation of fin isolation regions, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

Fin isolation in fin field effect transistors (finFETs) is achieved via the formation of fin isolation regions disposed between the fin structures. The fin isolation regions may correspond to shallow trench isolation (STI) regions formed after the fin structure definition. The fin structures may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

By way of example and not limitation, the formation of fin isolation regions can include multiple operations, for example: (i) the deposition of a liner material on the fin structures, (ii) the deposition of the main isolation material on the liner material, (ii) a post-deposition treatment for the main isolation material, (iii) a planarization operation for the main isolation material, and (iv) a recess operation to remove unwanted portions of the main isolation material. Each of the aforementioned processes may include additional sub-operations. For example, the post-deposition treatment of the main isolation material can include an annealing operation in wet steam to improve the quality of the deposited isolation material. In some embodiments, the isolation material can be silicon oxide or a silicon oxide based material, which further includes nitrogen and hydrogen.

During the post-deposition treatment, weak-point locations of the fin structure e.g., top corners of the fin structures where the top surface meets the sidewall surfaces of the fin structure can be oxidized by the wet steam. Fin oxidation proceeds inwards from the surface of the fin structure towards its center. If left uncontrolled, the oxidation process can form an oxide layer that effectively reduces the non-oxidized portion of the fin structures. In a subsequent recess operation of the fin isolation material, the oxidized portion of the fin structure can be unintentionally removed. Therefore, the width of the fin structure is reduced. In some embodiments, if oxidation is not uniform, pit defects can be formed on the fin structures. Defect formation and fin width loss can lead to transistors with degraded performance and performance variability, both of which are detrimental to the manufacturing yield.

The embodiments described herein are directed to a method for reducing fin oxidation during the formation of fin isolation regions. In some embodiments, top surfaces of the fin structures are capped with a silicon crystalline capping layer to prevent fin oxidation during the formation of the isolation regions. The crystalline silicon capping layer may not be sacrificial and may become part of the transistor structure. Therefore, the thickness and quality of the crystalline silicon capping layer needs to be controlled.

FIG. 1 is a flow chart of a fabrication method 100 which describes the formation process of a crystalline capping layer on top surfaces of crystalline fin structures to prevent fin oxidation during a subsequent fin isolation formation, according to some embodiments. Other fabrication operations may be performed between the various operations of method 100 and may be omitted merely for clarity and ease of description. These various operations are within the spirit and the scope of this disclosure. Moreover, not all operations may be needed to perform the disclosure provided herein. Additionally, some of the operations may be performed simultaneously, or in a different order than shown in FIG. 1. In some embodiments, one or more other operations may be performed in addition to or in place of the presently described operations. For illustrative purposes, method 100 will be described with reference to the embodiments shown in FIGS. 2-12. The figures provided to describe method 100 are for illustrative purposes only and are not to scale. In addition, the figures may not reflect the actual geometry of the real structures, features, or films. Some structures, films, or geometries may have been deliberately augmented for illustrative purposes.

Figure 2:
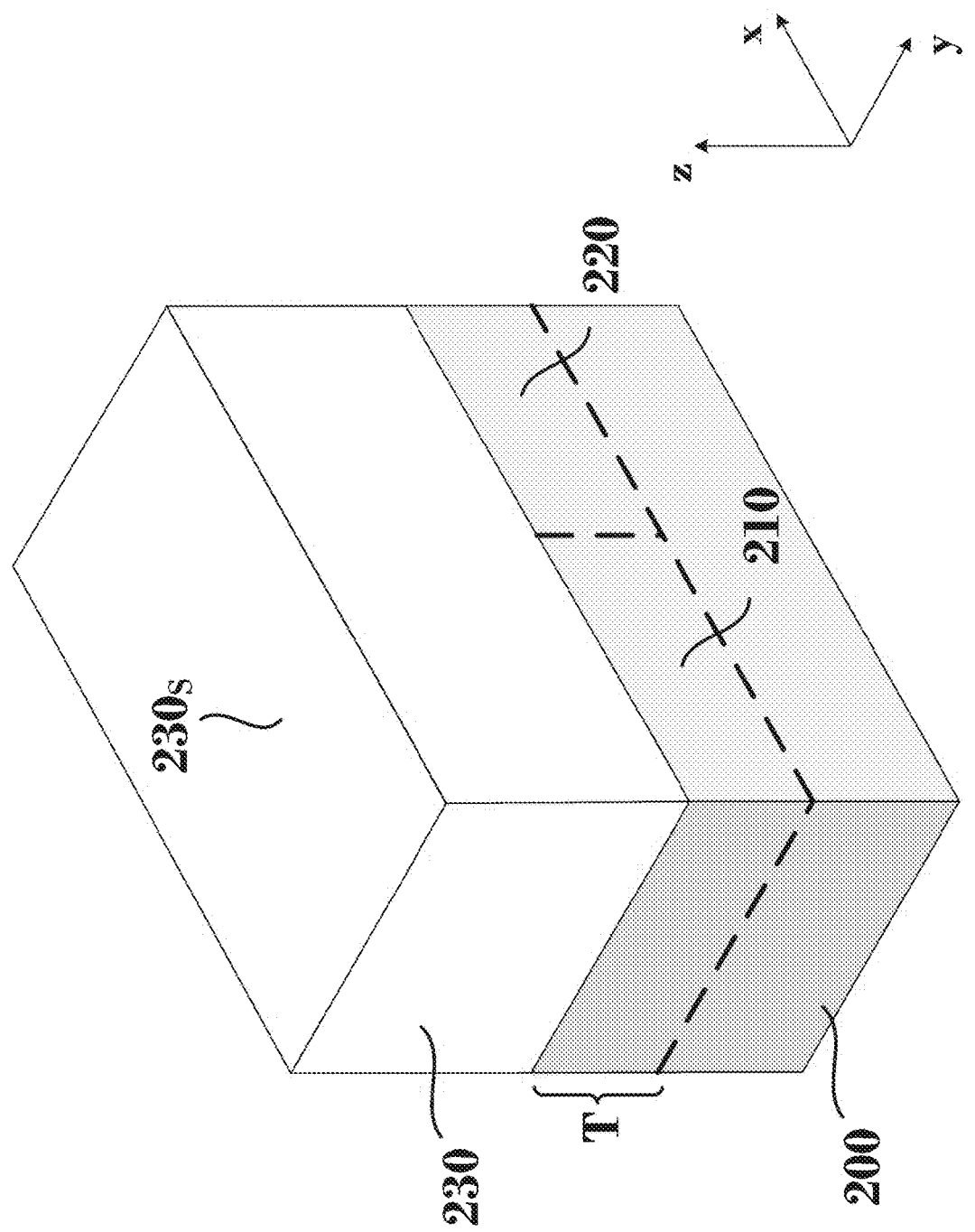
FIGS. 2-6 are isometric views of a substrate during the formation of fin structures having a crystalline silicon capping layer formed thereon, in accordance with some embodiments.

In referring to FIG. 1, method 100 begins with operation 110 and the process of growing a silicon epitaxial layer on a semiconductor substrate having n-type and p-type wells formed therein. By way of example and not limitation, a semiconductor substrate according to operation 110 is shown in FIG. 2, which is a partial isometric view of a semiconductor substrate 200 that includes a p-type well 210 and an n-type well 220 formed on a portion of its top surface.

In some embodiments, substrate 200 is a bulk semiconductor wafer or a top layer of a semiconductor on insulator (SOI) wafer such as, for example, silicon on insulator. Further, substrate 200 can be made of silicon (Si) or another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonids: (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, substrate 200 has a crystalline microstructure—e.g., it is not amorphous or polycrystalline.

For example purposes, substrate 200 in method 100 will be described in the context of crystalline silicon with its top surface parallel to the (100) crystal plane. Based on the disclosure herein, other materials, as discussed above, can be used. These materials are within the spirit and scope of this disclosure.

The doped wells (e.g., p-type well 210 and n-type well 220) can be formed, for example, doping a top portion of semiconductor substrate 200 with appropriate dopants. By way of example and not limitation, boron (B) can be implanted at a concentration between about $5 \times 10^{16}$ atoms/$cm^3$ and about $1 \times 10^{19}$ atoms/$cm^3$ by an ion implanter to form p-type well 210. Accordingly, n-type dopants, for example, (As), antimony (Sb), or phosphorous (P) can be implanted at concentrations between about $5 \times 10^{16}$ atoms/$cm^3$ and about $1 \times 10^{19}$ atoms/$cm^3$ by an ion implanter to form n-well 220. The aforementioned dopant species can be implanted at a depth that ranges between about 100 nm and about 500 nm. In other words, depth of doped wells 210 and 220 ranges between about 100 nm and about 500 nm. The "boundaries" of p and n-type wells 210 and 220 are represented by dashed lines. By way of example and not limitation, p-type well 210 and n-type well 220 may not extend over the entire top surface of semiconductor substrate 200. For example, multiple p-type wells 210 and n-type wells 220 may be formed on a top surface of semiconductor substrate 200. In some embodiments, formation of the doped wells further includes an activation anneal after the ion implantation to ensure that the dopants are activated within the semiconductor lattice.

According to operation 110, a silicon epitaxial layer 230 is grown on semiconductor substrate 200. In some embodiments, silicon epitaxial layer 230 is grown at a thickness between about 300 Å and about 1000 Å. By way of example and not limitation, silicon epitaxial layer 230 can be deposited with a chemical vapor deposition process. Source gases that can be used in the growth of silicon epitaxial layer 230 include, but are not limited to, silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas to reduce the aforementioned source gases. The deposition temperature during the epitaxial growth can range from about 700° C. to about 1250° C. depending on the gases used. For example, source gases with fewer chlorine atoms (e.g., like DSC) may require lower formation temperatures compared to source gases with more chlorine atoms, such as $SiCl_4$ or TCS. The aforementioned ranges and type of gases are provided as examples and are not limiting. In some embodiments, silicon epitaxial layer 230 is grown to cover the entire top surface of semiconductor substrate 200. However this is not limiting and silicon epitaxial layer 230 may be grown on desired areas of substrate 200 by using, for example, a patterned masking layer. According to some embodiments, silicon epitaxial layer 230 inherits the same crystallographic orientation as silicon substrate 200 since the substrate effectively functions as a seed layer for silicon epitaxial layer 230. This means that top surface 230s of silicon epitaxial layer 230 is also parallel to the (100) crystal plane.

In some embodiments, silicon epitaxial layer 230 can be intrinsic (e.g., un-doped) or doped. Silicon epitaxial layer 230 can be doped during the growth formation or after the growth. Further, silicon epitaxial layer 230 can be doped with the same or different type of dopants than the underlying doped wells and with the same or different dopant concentration.

Figure 3:
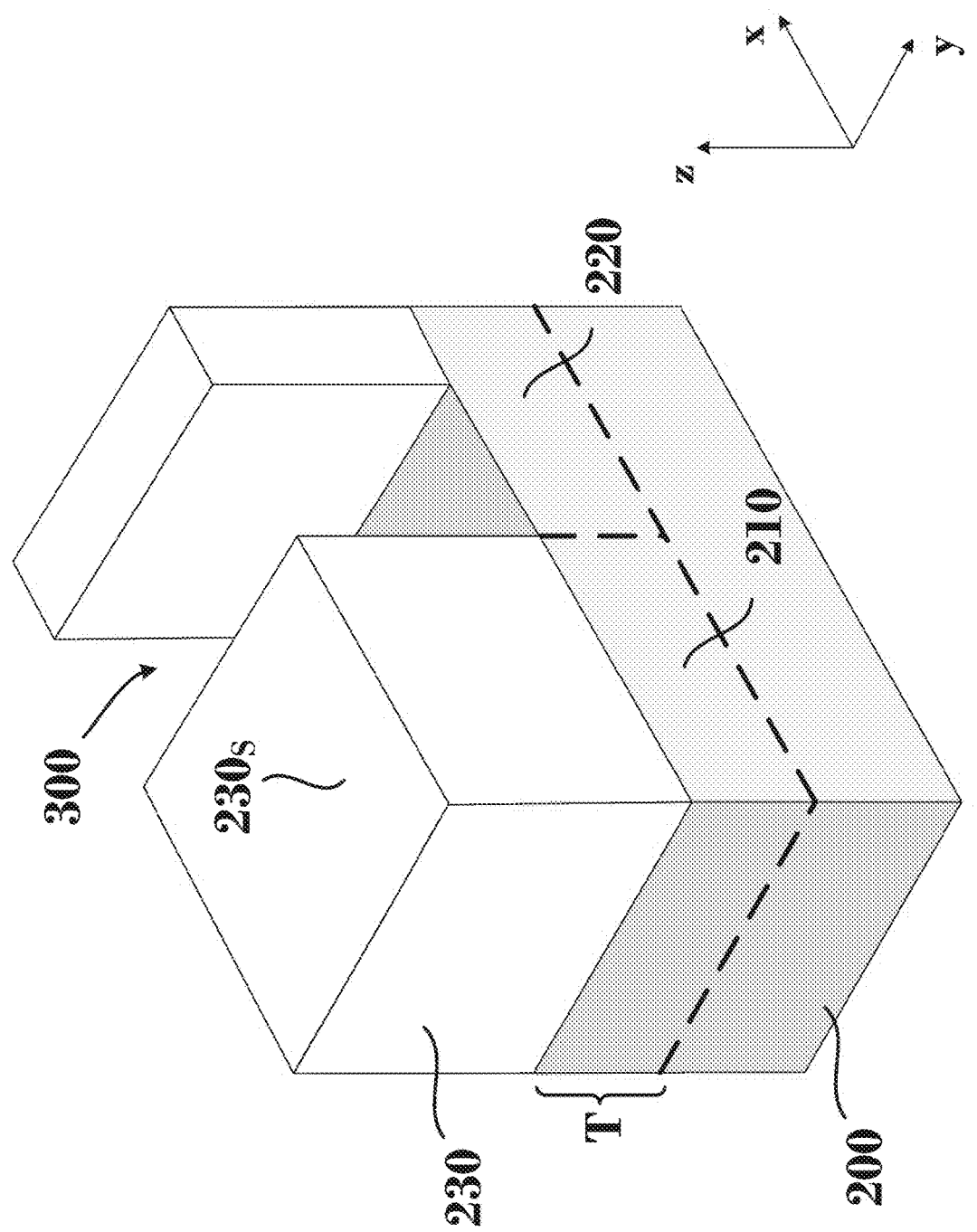

In referring to FIGS. 1 and 3, method 100 continues with operation 120 and the process of forming an opening 300 in silicon epitaxial layer 230 to expose a top surface of n-type well 220. In some embodiments, opening 300 is formed using photolithography and etching operations. By way of example and not limitation, a coat of photoresist (not shown) can be applied on silicon epitaxial layer 230. The photoresist can be subsequently exposed and developed according to a desired pattern; for example, a desired pattern could be openings aligned to n-type well 220 that expose the top surface of semiconductor substrate 200. The unexposed areas of the photoresist can be removed with a wet clean, leaving behind the desired pattern of developed photoresist on silicon epitaxial layer 230 over p-type well 210. The developed photoresist can be subsequently used as an etch mask. An anisotropic dry etching process can partially remove exposed portions of silicon epitaxial layer 230 to form opening 300. Areas of silicon epitaxial layer 230 covered by the developed photoresist (e.g., on top of p-type well 210) are protected from the etching chemistry and are therefore not removed. Once opening 300 is formed in silicon epitaxial layer 230, the remaining developed photoresist is removed with a wet clean. The result of this process is etched portions in silicon epitaxial layer 230, like opening 300 shown in FIG. 3.

In some embodiments, the dry etching process is terminated when the top surface of n-well. 220 is exposed. By way of example and not limitation, an etch stop layer may be used to signal the end of the etching process. By way of example and not limitation, a carbon doped layer can be formed within the top surface of the doped wells, prior to the formation of silicon epitaxial layer 230, to act as a etch stop layer and a dopant diffusion barrier. Alternatively, the n-type dopant concentration of n-type well 220 can be used to signal the end of the etching process since the etch rate of doped silicon can be different than that of the intrinsic silicon.

Figure 4:
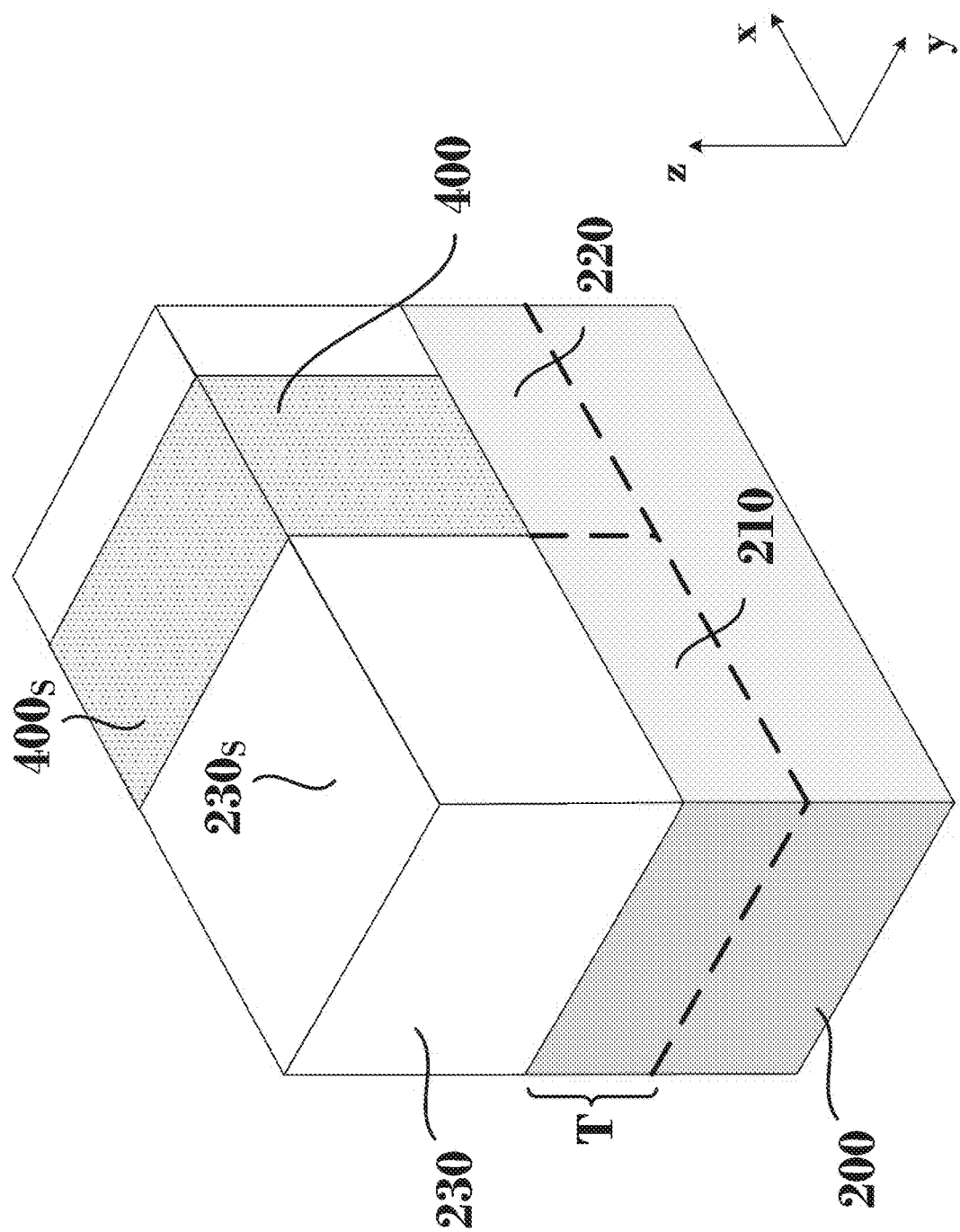

Referring to FIG. 1, method 100 continues with operation 130 and the process of growing a silicon germanium epitaxial layer on the exposed n-type well 220 to fill opening 300. In some embodiments, silicon germanium epitaxial layer is grown with a heteroepitaxial process. FIG. 4 shows the structure after the growth of silicon germanium epitaxial layer 400 on n-type well 220 within opening 300. In some embodiments, a planarization operation, such as a chemical mechanical polishing (CMP), polishes silicon germanium epitaxial layer 400 so that top surfaces of silicon germanium epitaxial layer 400 and silicon epitaxial layer 230 are substantially coplanar as shown in FIG. 4. By way of example and not limitation, precursor gases used for the silicon germanium epitaxial layer growth may include a combination of (i) $SiH_4$, $Si_2H_6$, $SiH_2Cl_2$, $GeH_4$, or HCl, and (ii) $H_2$, $N_2$, or Ar. In some embodiments, a buffer layer (not shown) may be deposited prior to the growth of silicon germanium epitaxial layer 400 to suppress growth defects due to the lattice mismatch between the gown silicon germanium and the underlying substrate 200. Further, opening 300 may be pre-treated prior to the growth of silicon germanium epitaxial layer 400 to remove native oxide layers formed during the etching process.

As in the case of silicon epitaxial layer 230, silicon germanium epitaxial layer 400 uses substrate 200 as a seed layer. Therefore, silicon germanium epitaxial layer 400 "inherits" the same crystallographic orientation with substrate 200, and its top surface $400_s$ is parallel to the (100) silicon crystal plane.

Figure 5:
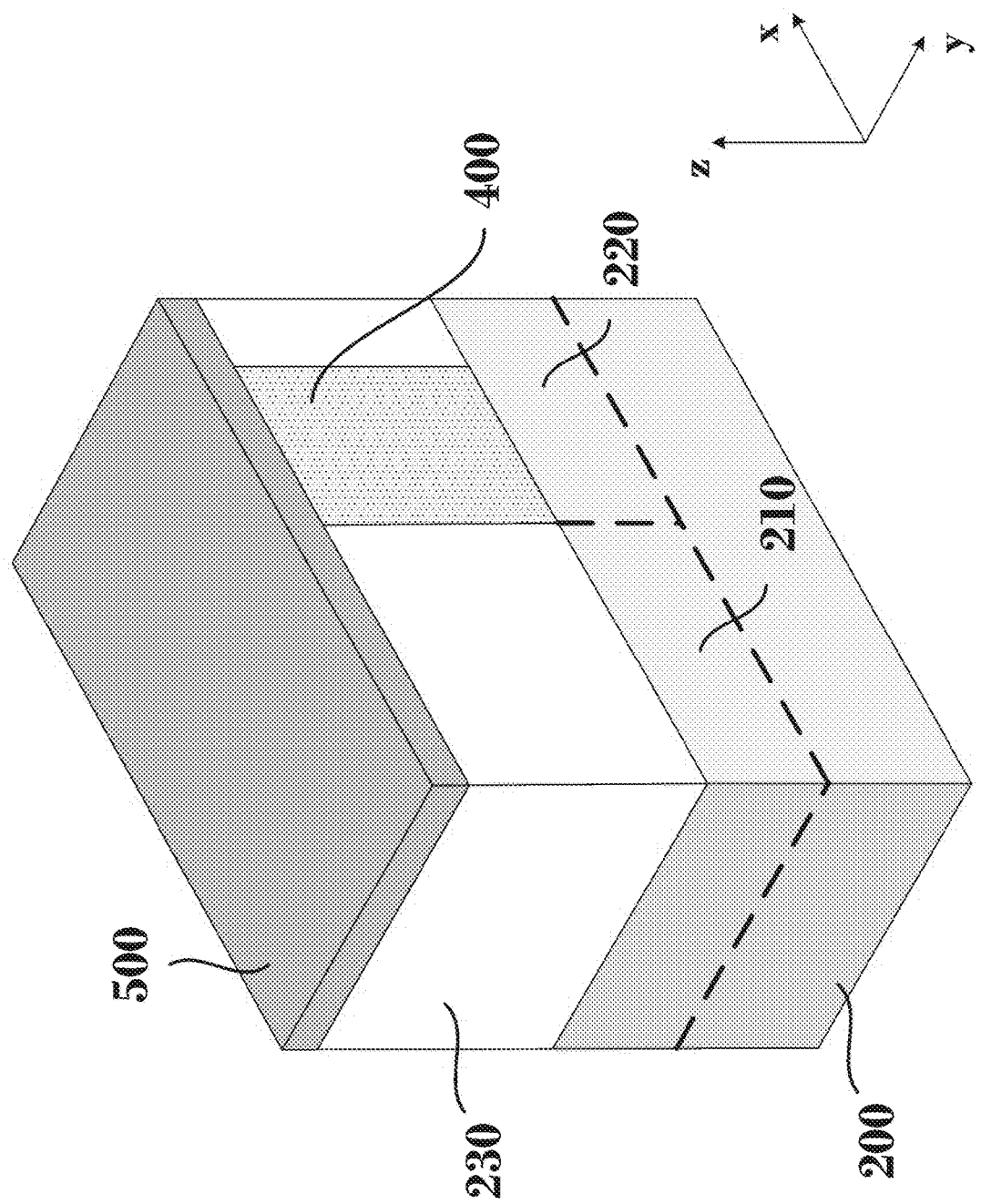

In referring to FIG. 1, method 100 continues with operation 140 and the process of growing a crystalline silicon capping layer on silicon epitaxial layer 320 and silicon germanium epitaxial layer 400. In some embodiments, the growth of the crystalline silicon capping layer occurs in a multi batch furnace capable of processing multiple wafers. In some embodiments, the wafers to be processed are stacked within the furnace and exposed to a chemical oxide removal (COR) process that removes the native oxide formed on the top surfaces of silicon epitaxial layer 320 and silicon germanium epitaxial layer 400. In some embodiments, the COR process uses hydrofluoric acid (HF) mixed with ammonia ($NH_3$). Once top surfaces $320_S$ and $400_S$ of silicon epitaxial layer 320 and silicon germanium epitaxial layer 400 respectively are free from native oxides, the crystalline silicon capping layer growth is initiated. In some embodiments, dichlorosilane ($SiH_2Cl_2$ or DSC) and hydrogen ($H_2$) are used to grow the crystalline silicon capping layer at a temperature between about 300° C. and 400° C. FIG. 5 shows crystalline silicon capping layer 500 grown on silicon epitaxial layer 230 and silicon germanium epitaxial layer 400. In some embodiments, crystalline silicon capping layer 500 has the same crystallographic orientation with the underlying silicon epitaxial layer 230 and silicon germanium epitaxial layer 400. For example, the top surface of crystalline epitaxial layer 500 is parallel to the (100) crystal plane.

In some embodiments, crystalline silicon capping layer 500 protects the top surface of silicon epitaxial layer 230 and silicon germanium epitaxial layer 400 from oxidation during the formation of the fin isolation regions. According to some embodiments, the thickness of crystalline silicon capping layer 500 is about 2 nm. A crystalline silicon capping layer thinner than about 2 nm does not provide adequate protection against fin oxidation, while crystalline silicon capping layers thicker than about 2 nm degrade the transistor's performance. This is because, as discussed earlier, crystalline silicon capping layer 500 is not sacrificial and, therefore, becomes part of the transistor structure. Thus, crystalline silicon capping layer 500 needs to be thick enough to prevent fin oxidation and thin enough to not impact the transistor's performance.

Figure 6:
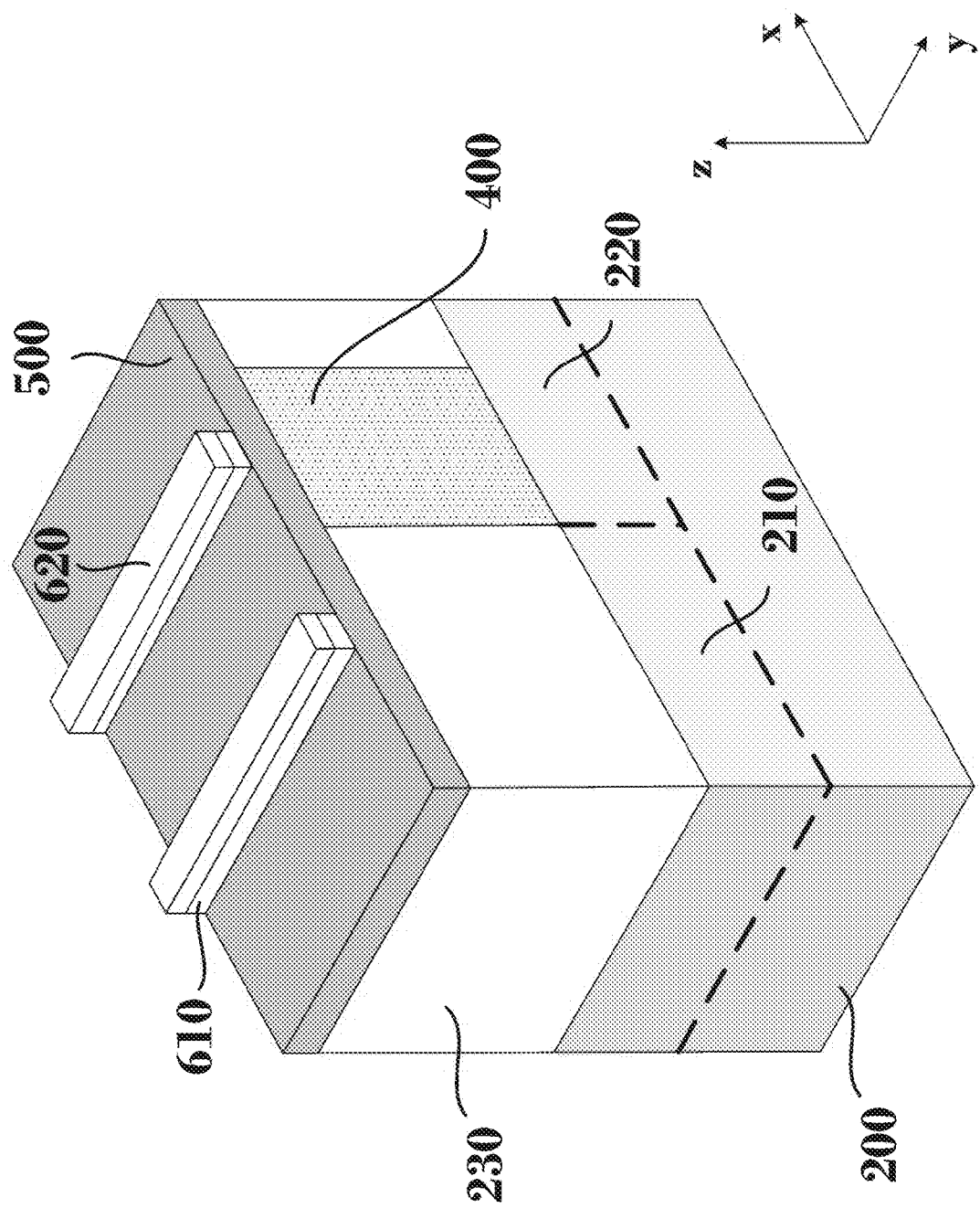

In referring to FIG. 1, method 100 continues with operation 150 and the process of forming the fin structures. As discussed earlier the fin structures may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures. According to some embodiments, FIG. 6 shows the final patterning operation for the formation of the fin structures where patterned layers 610 and 620 are disposed on crystalline silicon capping layer 500. In some embodiments, patterned layer 610 includes silicon oxide and patterned layer 620 includes silicon nitride ($Si_3N_4$).

Figure 7:
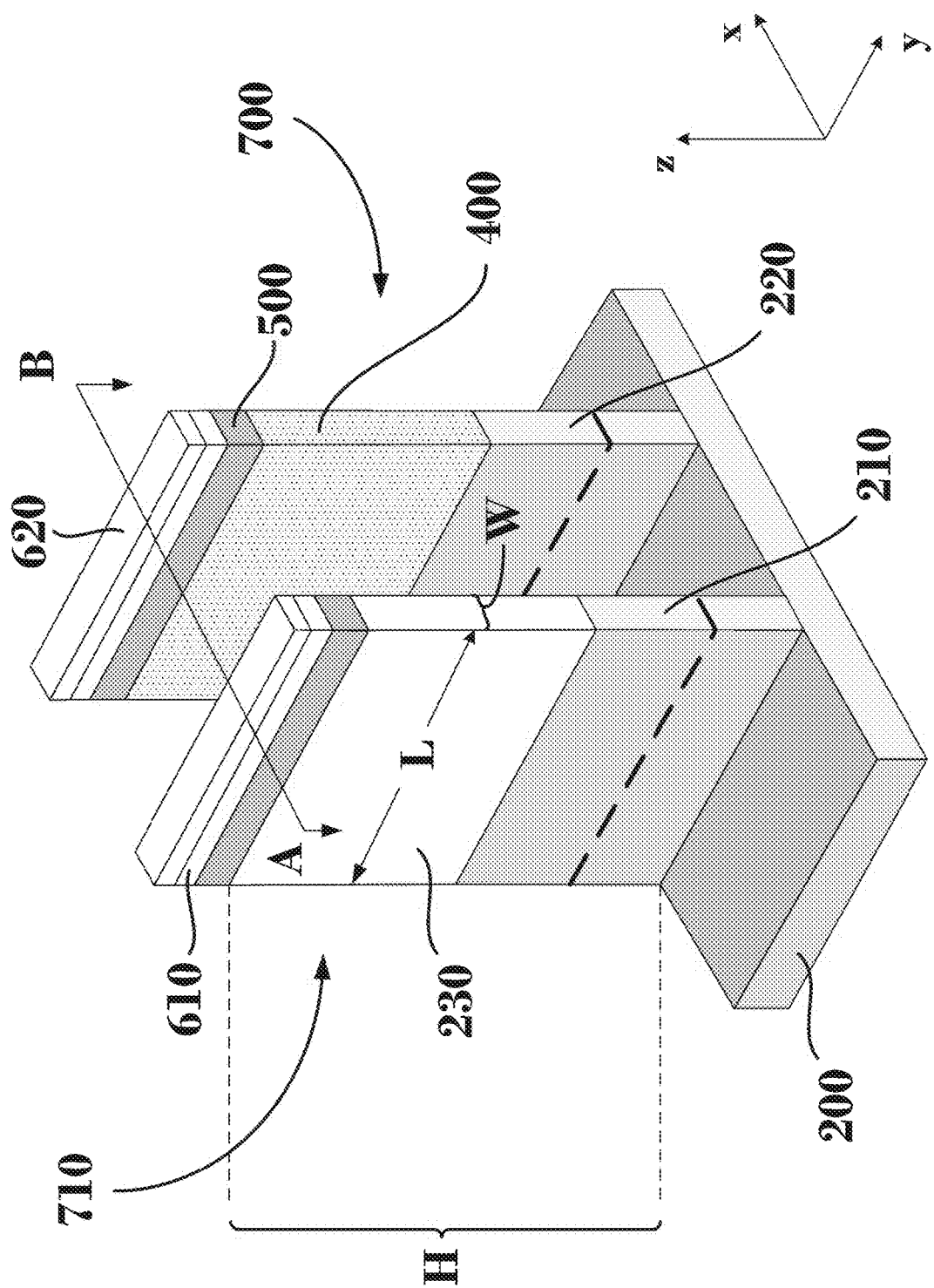
FIG. 7-12 are cross-sectional views of fin structures having a crystalline silicon capping layer formed thereon during the formation of a fin isolation region, in accordance with some embodiments.

The dimensions of patterned layers 610 and 630, which were defined by the photolithography processes described above, define in turn the width W, the length L, and the spacing of fin structures 700 and 710 shown in FIG. 7. The duration of the etching process can be used to define the height of fin structures 700 and 710. By way of example and not limitation, width W can range from about 5 nm to about 10 nm, while height H of fin structures 700 and 710 can range from about 35 nm to about 120 nm. Length L can by adjusted depending on the number, the pitch, and the size of the gate structures that will be formed perpendicular to the fin structures e.g., along the x-direction in subsequent fabrication operations. In some embodiments, additional fin structures, like fin structures 700 and 710, may be formed in other locations of substrate 200 e.g., adjacent to fin structures 700 and 710.

In some embodiments, fin structure 700 includes silicon germanium epitaxial layer 400 on n-type well 220 and fin structure 710 includes silicon epitaxial layer 230 on p-type well 210. According to some embodiments, a p-type finFET can be formed on fin structure 700 having a silicon germanium channel region and an n-type finFET can be formed on fin structure 710 having a silicon channel region. However, this is not limiting and p-type and n-type finFETs may be formed on fin structures 710 having a silicon channel region.

Figure 8:
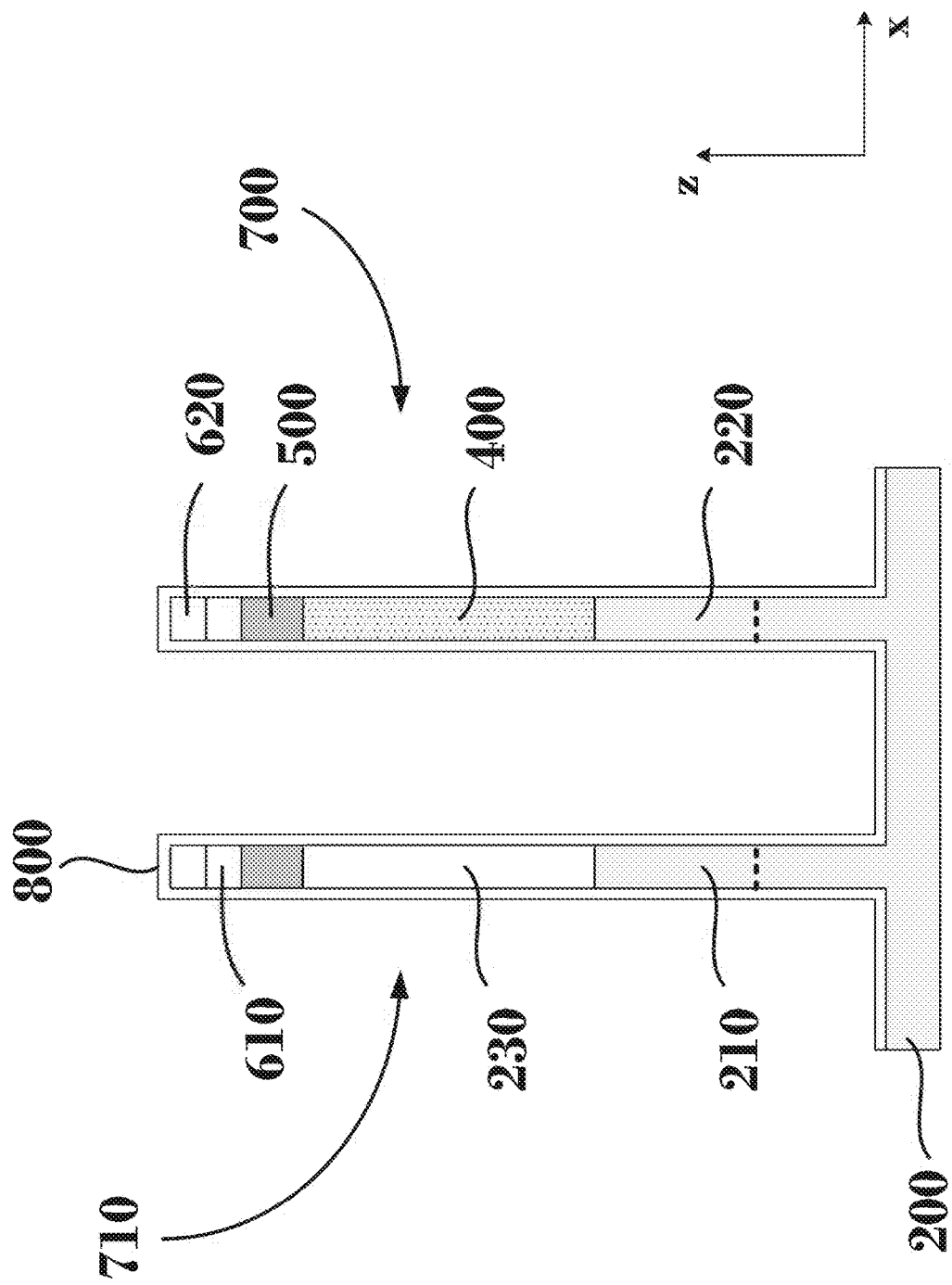

In referring to FIG. 1, method 100 continues with operation 160 and the process of depositing an isolation material between fin structures 700 and 710. In referring to FIG. 8, depositing the isolation material includes the deposition of a liner layer 800 over fin structures 700 and 710. According to some embodiments, FIG. 8 is a cross-sectional view of fin structures 700 and 710 along cut line AB shown in FIG. 7. By way of example and not limitation, liner layer 800 functions as an adhesion layer for the isolation material. Further, liner layer 800 serves as protection layer for the sidewall surfaces of fin structures 700 and 710 against oxidation. By way of example and not limitation, liner layer 800 can be deposited with a conformal deposition process, such as plasma-enhanced atomic layer deposition (PEALD), at a thickness of about 3 nm. By way of example and not limitation, liner layer 800 can be silicon oxide or a silicon oxide-based dielectric material.

Figure 9:
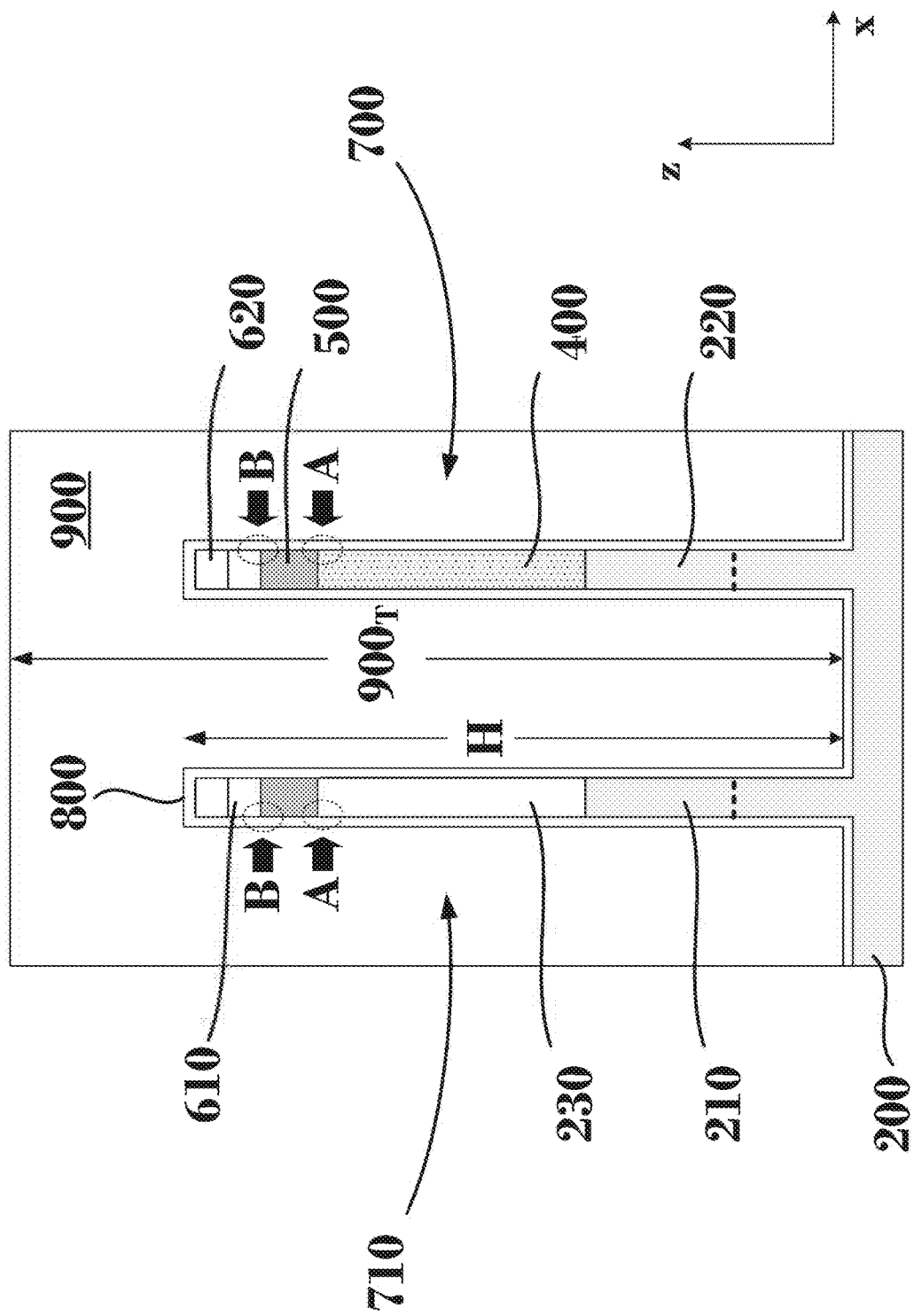

Subsequently, an isolation material 900 (e.g., the primary isolation material) is deposited to surround fin structures 700 and 710 as shown in FIG. 9. In some embodiments, isolation material 900 is deposited at a thickness $900_T$ that is about 3 times the height H of fin structures 700 and 710 (e.g., $900_T \sim H \times 3$). For example, if H is about 120 nm, then $900_T$ is about 360 nm. According to some embodiments, isolation material 900 is deposited with a flowable chemical vapor deposition process (e.g., flowable CVD) to ensure that isolation material 900 fills the space between fin structures 710 and 700 without forming seams or voids. In some embodiments, isolation material 900 is a silicon oxide based dielectric material that includes, for example, nitrogen and hydrogen. To further improve its dielectric and structural properties, isolation material 900 is subjected to a wet steam anneal (e.g., 100% water molecules) at a temperature between about 800° C. and 1200° C. During the wet steam anneal, isolation material 900 densifies and its oxygen content may increase.

According to some embodiments, crystalline silicon capping layer 500 prevents oxidation of fin structures 700 and 710 at "weak-point" locations A, such as the top corners of fin structures 700 and 710 where two different crystallographic planes meet plane (100) along the top surface of the fin structures and plane (110) along the sidewall surfaces of the fin. The top corners of fin structures 700 and 710 form a transition point where oxygen can diffuse through and oxidize fin structures 700 and 710 during the wet steam anneal. Growing crystalline silicon capping layer 500 on top surfaces of fin structures 700 and 710 "relocates" the weak-point from location A to location B and moves it "away" from the top surfaces of the fin structures. This is achieved because an epitaxial growth reproduces the crystal structure (and orientation) of the underlying layer for example, the atoms line up as if they are a continuation of the underlying crystal layer. In the case of crystalline silicon capping layer 500 and fin structure 700, which is a heteroepitaxial growth, crystalline silicon capping layer 500 will have the same symmetry as the underlying silicon germanium epitaxial layer 400 but a different distance between the silicon atoms due to the lattice mismatch between the silicon germanium under-layer and the crystalline silicon capping layer. However, due to the limited thickness of crystalline silicon capping layer 500 (e.g., about 2 nm) and the limited width of the fin structure 700 between about 5 nm and about 10 nm) defects related to lattice mismatch can be suppressed.

Figure 10:
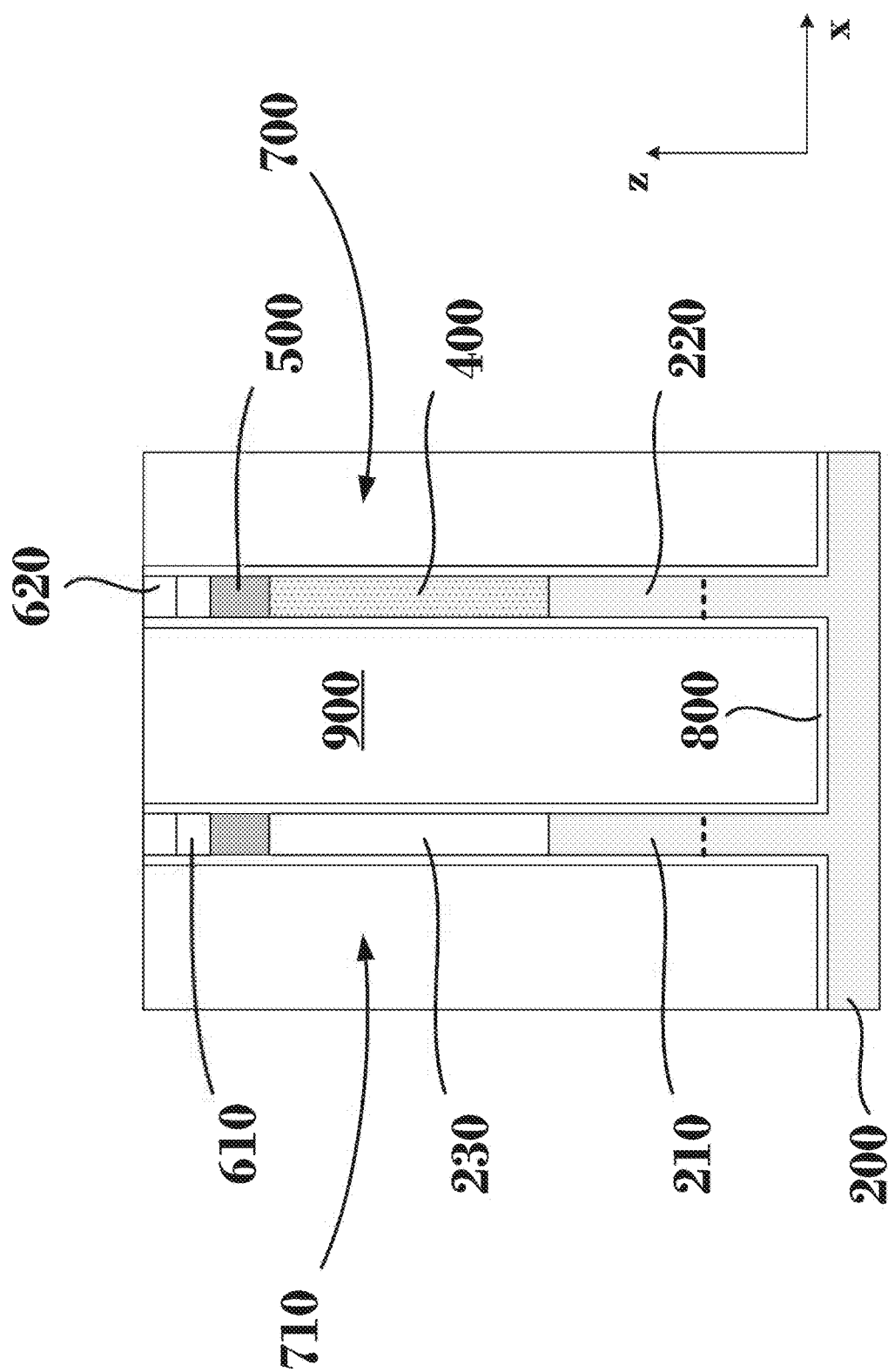
Figure 11:
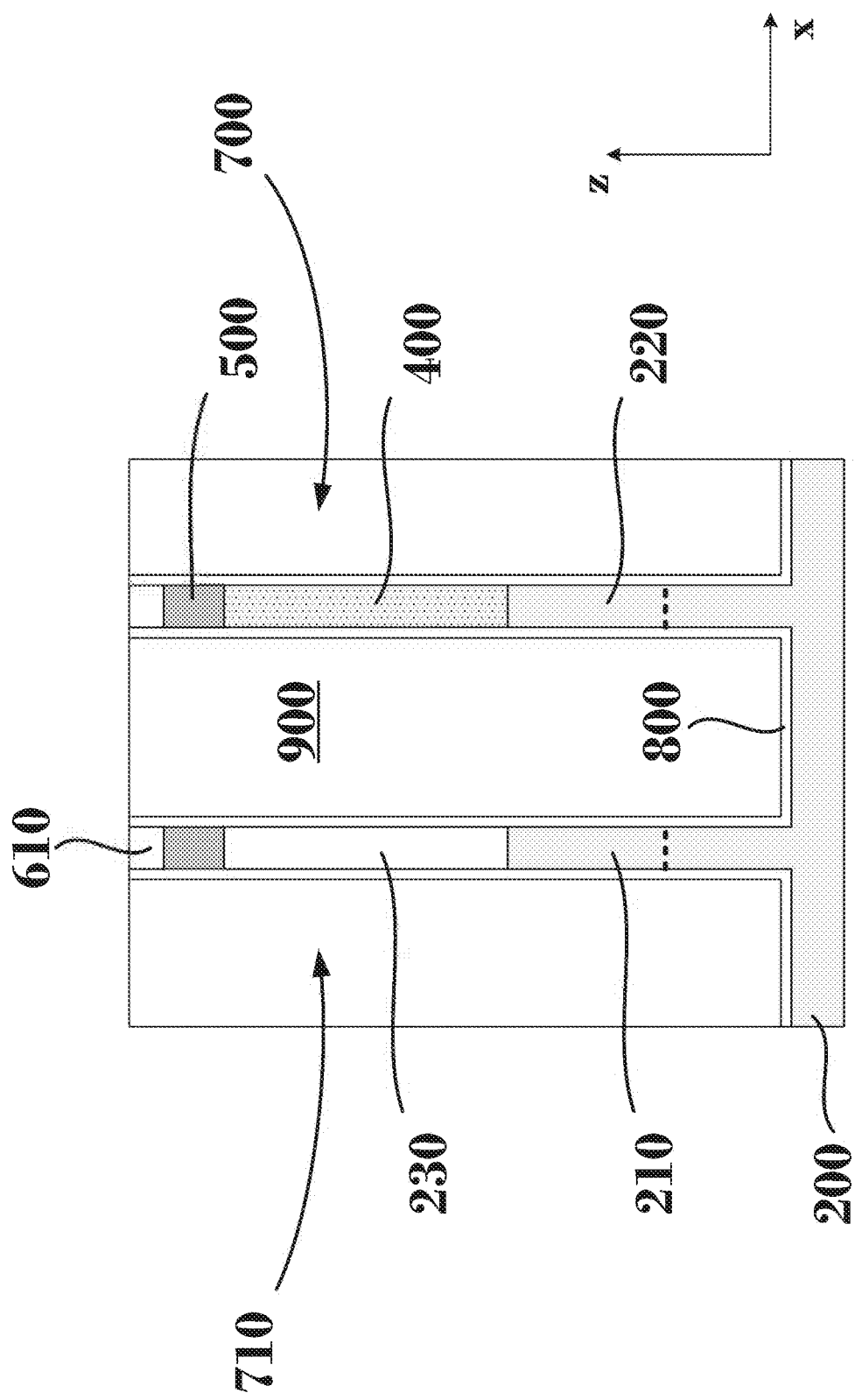

Subsequently, a CMP process polishes isolation material 900 as shown in FIG. 10 until patterned layer 620 on fin structures 700 and 710 is exposed. In some embodiments, patterned layer 620 functions as a polishing stop layer for the aforementioned CMP process. A CMP touch up may remove patterned layer 620 and expose patterned layer 610 as shown in FIG. 11. In some embodiments, the remaining patterned layer 620 is selectively removed with a wet etch chemistry that includes phosphoric acid ($H_3PO_4$).

Figure 12:
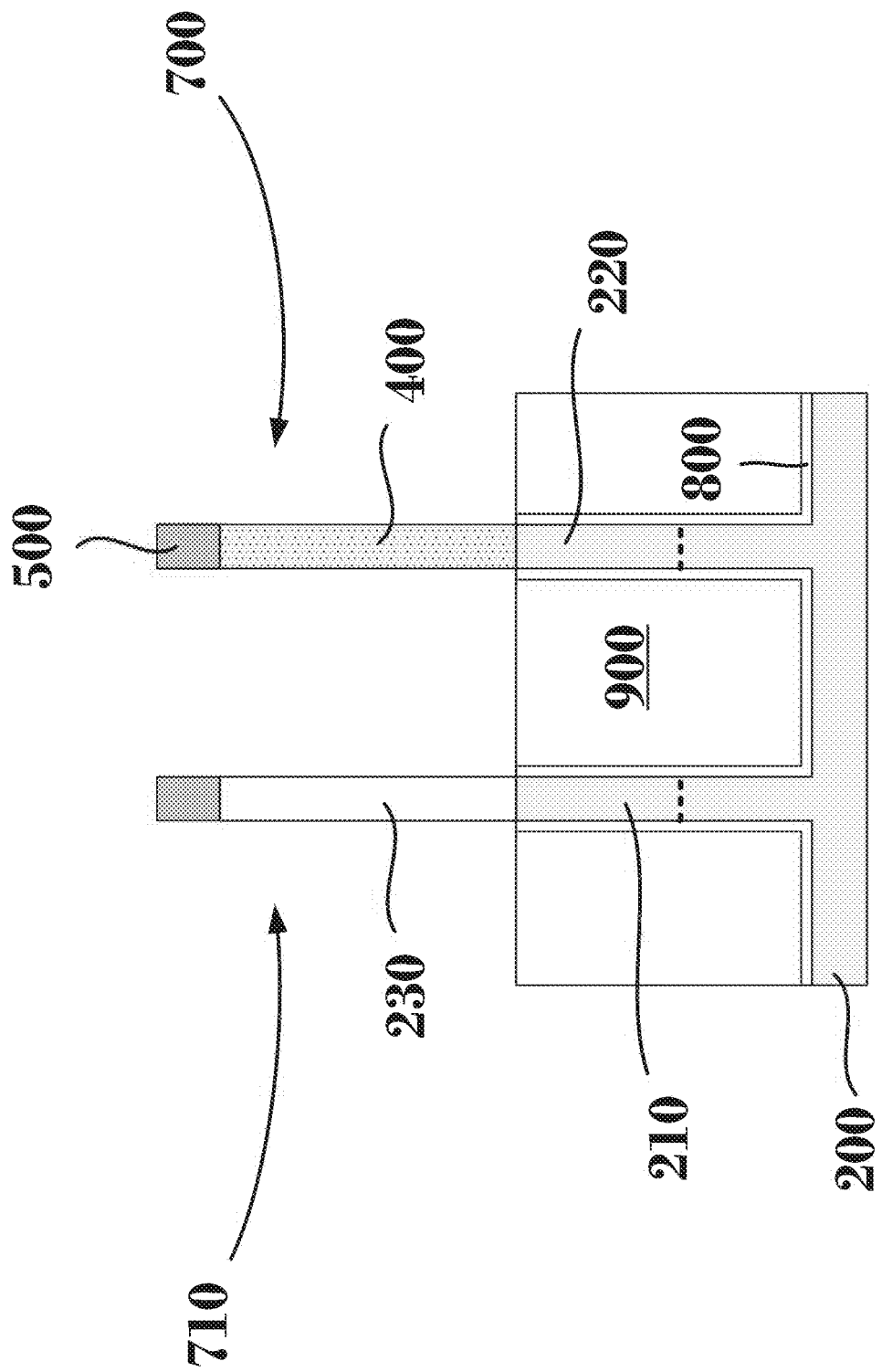

In referring to FIG. 1, method 100 continues with operation 170 and the process of recessing isolation material 900 with respect to fin structures 700 and 710 as shown in FIG. 12. In some embodiments, the recess operation also "pulls back" liner layer 800. This is because the dry etching chemistry used in the recess process of isolation material 900 is also selective towards liner layer 800. In some embodiments, the recess process includes, but is not limited to, fluorocarbon chemistry. As a result of the aforementioned recess process, the top portions of fin structures 700 and 710 are exposed while the bottom portions remain embedded in isolation material 900. Further, during the recess operation described above, any oxide formed on the sidewalls of fin structures 700 and 710 during any of the oxidation process described in the method 100 will be removed.

Figure 13:
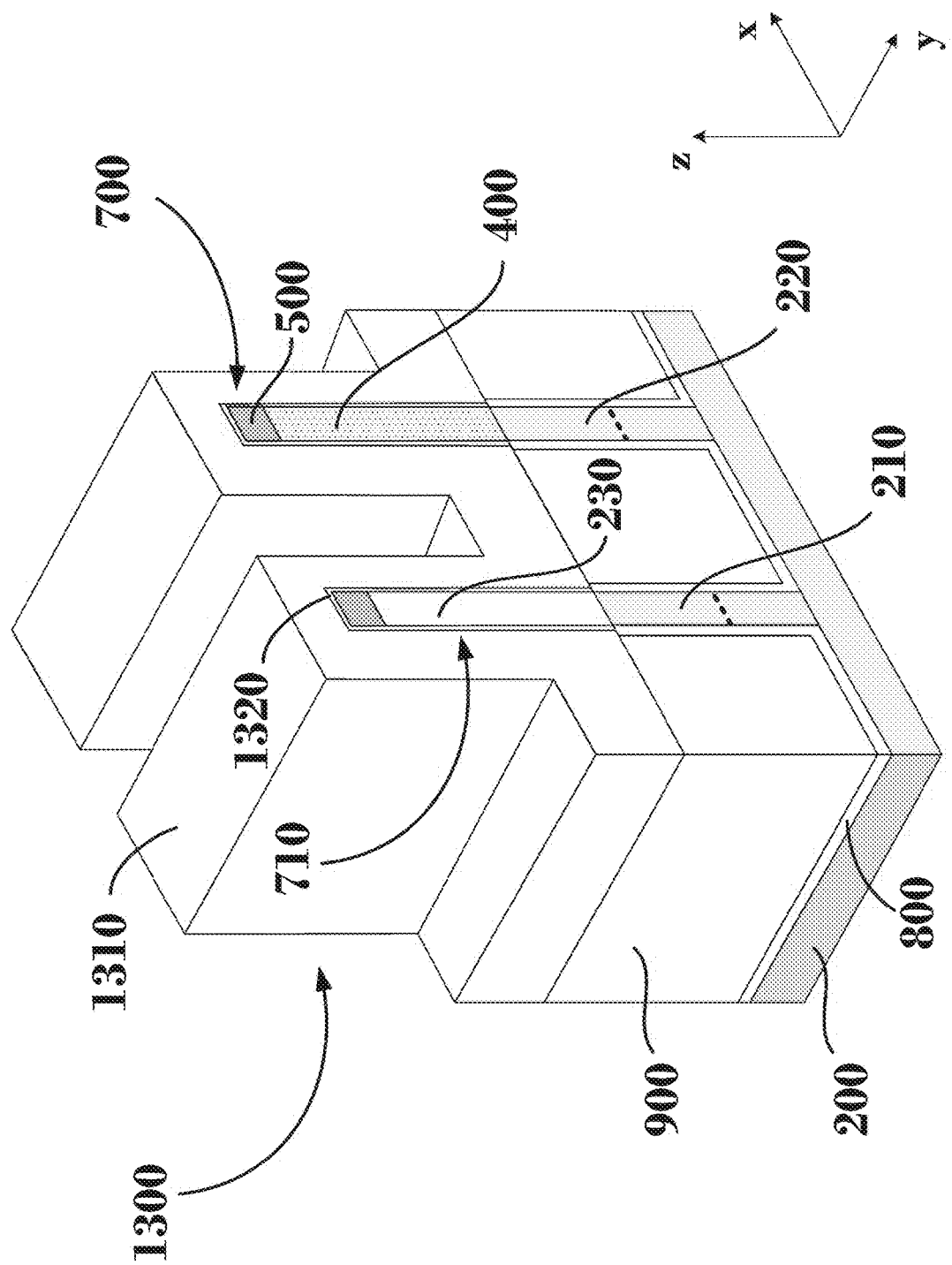
FIG. 13 is a partial isometric view of p-type and n-type transistors, in accordance with some embodiments.

According to some embodiments, FIG. 13 is a partial isometric view of fin structures 700 and 710 after the formation of gate stack 1300 thereon. In some embodiments, gate stack 1300 includes a gate electrode 1310 and a gate dielectric stack 1320 interposed between gate electrode 1310 and fin structures 700 and 710. Gate stack 1300 along with each fin structures 700 and 710, and respective source/drain epitaxial regions (not shown) form transistor structures. For example, the transistor structure formed on fin structure 700 is a p-type finFET and the transistor structure formed on fin structure 710 is an n-type finFET as discussed above. In some embodiments, the gate stack 1300 for fin structure 700 may include different metallic layers than the gate stack 1300 for fin structure 710.

The embodiments described herein are directed to a method for preventing fin oxidation during the formation of fin isolation regions. According to some embodiments, the method includes depositing a crystalline silicon layer on the top surfaces of the formed fin structures as a capping layer to prevent fin oxidation during the formation of the isolation regions. In some embodiments, the crystalline silicon capping layer is not sacrificial and can be integrated in the transistor structure. In some embodiments, the crystalline silicon layer is epitaxial grown at a thickness of about 2 nm having a top surface parallel to the (100) silicon crystal plane.

In some embodiments, a semiconductor structure includes a semiconductor substrate with a first fin structure and a second fin structure formed on the semiconductor substrate. The first fin structure includes a first epitaxial layer and a second epitaxial layer thinner than the first epitaxial layer. The second fin structure includes a third epitaxial layer different from the first epitaxial layer and the second epitaxial layer, where the second epitaxial layer is thinner than the third epitaxial layer. The semiconductor structure further includes an isolation region between the first and second fin structures.

In some embodiments, a semiconductor structure includes a crystalline substrate and a first transistor structure with a first crystalline fin structure formed on the crystalline substrate. The first crystalline fin structure includes a p-doped region of the crystalline substrate, a silicon layer epitaxially grown on the p-doped region, and a first silicon capping layer epitaxially grown on the silicon layer. The semiconductor structure further includes a second transistor structure with a second crystalline fin structure formed on the crystalline substrate. The second crystalline fin structure includes an n-doped region of the crystalline substrate, a silicon germanium layer epitaxially grown on the n-doped region, and a second silicon capping layer epitaxially grown on the silicon germanium layer. Additionally, the semiconductor structure includes an isolation stack formed between the first and second crystalline fin structures.

In some embodiments, a method includes providing a semiconductor substrate with an n-doped region and a p-doped region formed on a top portion of the semiconductor substrate; epitaxially growing a first layer on the p-doped region; epitaxially growing a second layer different from the first layer on the n-doped region; epitaxially growing a third layer on top surfaces of the first and second layers, where the third layer is thinner than the first and second layers. The method further includes etching the first, second, and third layers to form fin structures on the semiconductor substrate, and forming an isolation region between the fin structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a p-doped region in a substrate;
   forming an n-doped region in the substrate;
   epitaxially growing a first semiconductor layer on the p-doped region;
   epitaxially growing a second semiconductor layer different from the first semiconductor layer on the n-doped region;
   epitaxially growing a capping layer on the first and second semiconductor layers;
   etching the p-doped region, the first semiconductor layer, and a first portion of the capping layer on the p-doped region to form a first fin structure on the substrate;
   etching the n-doped region, the second semiconductor layer, and a second portion of the capping layer on the n-doped region to form a second fin structure on the substrate; and
   forming an isolation region between the first and second fin structures, wherein a top surface of the isolation region is coplanar with top surfaces of first and second semiconductor layers.

2. The method of claim 1, wherein epitaxially growing the capping layer comprises epitaxially growing the capping layer with a thickness less than that of the first and second semiconductor layers.

3. The method of claim 1, wherein epitaxially growing the capping layer comprises performing a heteroepitaxial deposition on the second semiconductor layer.

4. The method of claim 1, wherein epitaxially growing the capping layer comprises epitaxially growing the capping layer with a crystallographic orientation that is same as a crystallographic orientation of the first or second semiconductor layer.

5. The method of claim 1, wherein epitaxially growing the capping layer comprises epitaxially growing a silicon layer with a thickness of about 2 nm and a top surface parallel to an (100) crystal plane.

6. The method of claim 1, wherein epitaxially growing the first semiconductor layer comprises epitaxially growing a silicon layer.

7. The method of claim 1, wherein epitaxially growing the second semiconductor layer comprises epitaxially growing a silicon germanium layer.

8. The method of claim 1, wherein forming the isolation region comprises:
   depositing a dielectric layer on the first and second fin structures; and
   etching the dielectric layer to have a top surface of the dielectric layer coplanar with top surfaces of the p-doped and n-doped regions.

9. The method of claim 1, wherein forming the isolation region comprises:
   depositing a dielectric layer on the first and second fin structures; and
   etching the dielectric layer to expose sidewalls of the first semiconductor layer of the first fin structure and sidewalls of the second semiconductor layer of the second fin structure.

10. The method of claim 1, further comprising depositing a dielectric layer on the first and second fin structures prior to forming the isolation region.

11. A method, comprising:
    forming a p-doped region in a substrate;
    forming an n-doped region in the substrate;
    epitaxially growing a first semiconductor layer on the p-doped and n-doped regions;
    etching a portion of the first semiconductor layer to expose a top surface of the n-doped region;
    epitaxially growing a second semiconductor layer on the n-doped region;
    epitaxially growing a third semiconductor layer on the first and second semiconductor layers;
    etching a first portion of the third semiconductor layer on the p-doped region, the first semiconductor layer, and the p-doped region to form a first fin structure on the substrate;
    etching a second portion of the third semiconductor layer on the n-doped region, the second semiconductor layer, and the n-doped region to form a second fin structure on the substrate; and forming a gate structure on the first and second fin structures.

12. The method of claim 11, wherein epitaxially growing the first semiconductor layer comprises epitaxially growing a silicon layer.

13. The method of claim 11, wherein epitaxially growing the second semiconductor layer comprises epitaxially growing a silicon germanium layer.

14. The method of claim 11, wherein epitaxially growing the third semiconductor layer comprises epitaxially growing a silicon layer with a top surface parallel to an (100) crystal plane.

15. The method of claim 11, further comprising:
depositing a dielectric layer on the first and second fin structures; and
etching the dielectric layer to expose sidewalls of the first semiconductor layer of the first fin structure and sidewalls of the second semiconductor layer of the second fin structure.

16. The method of claim 11, further comprising:
depositing a dielectric layer on the first and second fin structures; and
etching the dielectric layer to have a top surface coplanar with top surfaces of the p-doped and n-doped regions.

17. A method, comprising:
forming a first fin structure comprising:
a p-doped region on a substrate,
a first semiconductor region on the p-doped region, and
a second semiconductor region on the first semiconductor region;
forming a second fin structure comprising:
an n-doped region on a substrate,
a third semiconductor region on the n-doped region, and
a fourth semiconductor region on the third semiconductor region;
forming a dielectric layer on the first and second fin structures;
etching the dielectric layer to expose sidewalls of the second semiconductor layer of the first fin structure and sidewalls of the fourth semiconductor layer of the second fin structure; and
forming a gate structure on the first and second fin structures.

18. The method of claim 17, wherein forming the first fin structure further comprises:
forming a first silicon region on the p-doped region in a first epitaxial growth process; and
forming a second silicon region on the first silicon region in a second epitaxial growth process.

19. The method of claim 17, wherein forming the second fin structure further comprises:
forming a silicon germanium region on the n-doped region in a first epitaxial growth process; and
forming a silicon region on the silicon germanium region in a second epitaxial growth process.

20. The method of claim 17, further comprising forming an isolation region between the first and second semiconductor regions.

* * * * *